United States Patent [19]

Yamamoto et al.

[11] Patent Number: 5,409,890
[45] Date of Patent: Apr. 25, 1995

[54] PROCESS FOR PRODUCING AN ELONGATED SINTERED ARTICLE

[75] Inventors: Susumu Yamamoto; Nozomu Kawabe; Tomoyuki Awazu; Teruyuki Murai, all of Hyogo, Japan

[73] Assignee: Sumitomo Electric Industries, Ltd., Osaka, Japan

[21] Appl. No.: 122,178

[22] Filed: Sep. 17, 1993

Related U.S. Application Data

[63] Continuation of Ser. No. 804,536, Dec. 11, 1991, abandoned, which is a continuation of Ser. No. 707,279, May 28, 1991, abandoned, which is a continuation of Ser. No. 571,823, Aug. 24, 1990, abandoned, which is a continuation of Ser. No. 227,619, Aug. 3, 1988, abandoned.

[30] Foreign Application Priority Data

| Aug. 3, 1987 | [JP] | Japan | 62-194037 |
| Sep. 5, 1987 | [JP] | Japan | 62-222641 |
| Sep. 5, 1987 | [JP] | Japan | 62-222642 |
| Sep. 5, 1987 | [JP] | Japan | 62-222643 |

[51] Int. Cl.$^6$ .................................. H01L 39/24
[52] U.S. Cl. ................................. 505/433; 29/599; 505/500
[58] Field of Search ............... 505/430, 433, 434, 500, 505/704, 705; 29/599

[56] References Cited

U.S. PATENT DOCUMENTS 4,952,554  8/1990  Jin et al. .................................. 505/1

OTHER PUBLICATIONS

"High $T_c$ Superconductors–Composite Wire Fabrication", Jin et al, Applied Physics Letter, vol. 51, No. 3, 20 Jul. 1987.

Primary Examiner—Joseph M. Gorski
Attorney, Agent, or Firm—Kerkam, Stowell, Kondracki & Clarke; John C. Kerins

[57] ABSTRACT

Improvement in a process for producing a sintered elongated article by the steps comprising filling a metal pipe with a material powder, carrying out plastic deformation of the metal pipe and then subjecting the material powder in deformed metal pipe to sintering. In the invention, the step of the plastic deformation includes at least one deformation satge carried out under a hot condition.

13 Claims, No Drawings

PROCESS FOR PRODUCING AN ELONGATED SINTERED ARTICLE

This application is a continuation of U.S. application Ser. No. 804,536, filed on Dec. 11, 1991, and now abandoned, which in turn is a continuation of U.S. application Ser. No. 707,279, filed on May 28, 1991, and now abandoned, which in turn is a continuation of U.S. application Ser. No. 571,823, filed on Aug. 24, 1990, and now abandoned, which in turn is a continuation of U.S. application Ser. No. 227,619, filed on Aug. 3, 1988, and now abandoned.

BACKGROUND OF THE INVENTION

1. Field of the Invention

The present invention relates to a process for producing an elongated sintered article. More particularly, it relates to an improved process for producing an elongated sintered article in a form of wire, rod, tape or the like from a powder material.

The process according to the present invention is applicable to so called new ceramics, fine ceramics or sintered alloys which are difficult of shaping or working by the conventional techniques such as wire-drawing, rolling or extrusion.

The process according to the present invention is advantageously applicable for manufacturing a wire of a compound oxide type superconductor.

2. Description of the Related Art

New ceramics, fine ceramics and sintered alloys possess a wide variety of functions, and hence their applications are spreading over a variety of industrial fields. They have a high thermal conductivity and a high resistance to chemicals. In addition to these inherent properties, some ceramics possess the other unique properties. In fact, transparent ceramics, histocompatible ceramics or electro-conductive ceramics are known. Such variety of the properties or functions come from such a fact that the ceramics are composed of a large number of elements which can be combined in a wide range.

The term ceramics used in this specification implies any sintered article produced by a solid reaction in a sintering technique from powder materials including inorganic powders and metal powders. The ceramics to which the present invention is applicable may be oxide type ceramics such as alumina, beryllia, zirconia, ferrites ($MO,Fe_2O_3$), PLZT [$(Pb,La)(Zr,Ti)O_3$] or the like, non-oxide type ceramics such as nitride, for example $Si_3N_4$ or AlN, carbide such as SiC or WC, boron carbide, carbide precipitating type cobalt-based alloy or the like. Some of them are often called sintered alloys.

Alumina is one of very popular ceramics used in machine parts and now is used as a substrate material for IC. Silicon carbide and silicon nitride possess a high abrasion-resistance and a high strength at a high temperature range, so that they are used as machine parts used in an internal combustion engine or in a high temperature conveyer machine. Tungsten carbide and the carbide precipitating type cobalt-based alloy possess a very high hardness and a high stiffness, so that they are used as a cutting tool or a printer head or the like.

However, working and machining or cutting of these materials are very difficult to perform because of their hardness which is one of their inherent properties. In fact, it is very difficult to cut the sintered bodies of these materials by ordinary cutting tools so that they have been machined only by electro spark machining technique or diamond cutting technique. In other words, they are impossible or difficult to be deformed or shaped into elongated articles such as tape, wire or pipe by the conventional plastic deformation techniques such as rolling or wire-drawing.

In the conventional technique for producing an elongated article of ceramic, in order to minimize a cutting work after a sintering stage, a powder material is molded into a compact at first before the compact is baked in a sintering furnace. For, example, a ceramic shaft has been produced by such steps that a powder material is press-molded into a rod having a rectangular cross section in a mold and then the resulting molded article is shaped in a trimming step before the press-molded article is passed to a sintering furnace. This conventional technique, however, is not economical because of poor productivity and waste of expensive powder material and also is not suitable for a continuous operation because an elongated article having a long length can not be produced.

In another conventional method for producing a ceramic article, the powder material is blended with organic binder to prepare a paste from which a pre-form is produced in a moulding or shaping stage. The pre-form molded in a form of rod or tape is heated to remove the binder and then sintered finally. Although this process is much better than the above-mentioned press molding technique, it is difficult to remove the organic binder completely during the intermediate heating stage, so that the binder remain in the finally sintered article, resulting in a cause of defects of the product which will lower the strength and the resistance to flexion.

In the case of sintered metallic alloys such as carbide precipitating type cobalt-based alloy, it is also possible to adopt several special techniques such as (i) centrifugal casting process, (ii) rotary spinning process in water and (iii) metal plating process in addition to the above-mentioned ceramic molding techniques. However, it is difficult to produce an elongated article of high quality by the centrifugal casting process. The maximum length of a wire produced by the process (i) is limited to 50 cm in case of a diameter of 2 mm. In the case of the rotary spinning process (ii), it is difficult to control precisely a diameter of a wire to be produced and the maximum diameter of the wire is limited to 1 mm. The metal plating process (iii) is used for diffusing metal such as Co, W, Cr or the like into a carbon fiber. However, this technique is not applicable to the other metals and is poor in productivity.

Conclusively, it is impossible or difficult to manufacture elongated ceramic articles of high quality economically by the conventional techniques, and hence there remains a strong demand to establish another industrial process for manufacturing elongated articles.

The present inventors proposed a unique process for manufacturing an elongated article by the steps comprising filling a metal pipe with a material powder of ceramic, performing plastic deformation of the metal pipe filled with the ceramic metal powder to reduce the cross section of the metal pipe, and then subjecting the deformed metal pipe to heat-treatment to sinter the ceramic material powder filled in the metal pipe in in the U.S. patent application Ser. Nos. 152,713, 161,480, 182,489 and 189,366.

The processes themselves are satisfactory but it is still requested to improve the properties such as the density or the strength of the products obtained by these process. The present invention concerns an improvement in these process.

An object of the present invention is to improve our previous processes and to provide an improved process for producing an elongated article having an improved quality.

Another object of the present invention to apply the improved process for a production of a superconducting wire of compound oxide.

SUMMARY OF THE INVENTION

The present invention provides an improved process for producing a sintered elongated article by the steps comprising filling a metal pipe with a material powder, carrying out plastic deformation of the metal pipe filled with the material powder and then subjecting the deformed metal pipe filled with the material powder to heat-treatment at a sintering temperature of the material powder.

The improvement according to the present invention reside in that the step of said plastic deformation includes at least one hot-plastic deformation stage. The expression of "include" mean that the plastic deformation step of the present invention include additionally a cold-plastic deformation stage in addition to the hot-plastic deformation stage.

The plastic deformation in the previous patent applications mentioned above had been effected mainly by the cold-plastic deformation. However, we found such a fact that the quality or the properties of the product obtained were improved when the hot-plastic deformation stage is incorporated in the process and complete the present invention. In fact, the increment of the density of a wired powder material and the improvement of the efficiency of metal work are achieved simultaneously by the hot-plastic deformation.

The expression of "hot-plastic deformation" mean such a plastic deformation that is performed at a temperature which is higher than a recrystallization temperature of a metal of which the metal pipe is made. In fact, the deformation of the metal pipe can be effected advantageously above the temperature since the resistance to deformation decrease remarkably and a high malleability is achieved without work hardness even if recrystallization occur after the deformed pipe is cooled down to ambient temperature. In practice, the hot-plastic deformation is carried out a temperature which is lower than a melting point of said metal by at least 10° C. or more to prevent fusion of the metal pipe.

Since the density of the powder material compacted in the metal pipe is not high, a diameter of the metal pipe fulled with the powder material should be reduced before the final sintering operation in order to increase the density of compacted powder. According to the present invention, the plastic deformations is performed in such manner that a compressive stress is exerted onto the powder material filled in the metal pipe. Such plastic deformation is preferably carried out by a conventional technique selected from wire-drawing through a die or dies, wire-drawing by a roller die or roller dies, extrusion, forging, swaging or rolling. Persons skilled in the art can select the mode or type of plastic deformation which depends on the material of the metal pipe and the nature of the powder material.

According to a preferred embodiment of the present invention, the plastic deformation is carried out by a combination of a plurality of unit operations each of which is same and/or different in mode. In other words, the same or different elemental plastic deformation can be effected on the metal pipe successively and/or alternately in order to improve the quality of the product. Examples of the combination of unit operations are a combination of wire-drawing and forging whose objects are different from each other, a combination of wire-drawing through a die and swaging are performed by different means, and a combination of hot-plastic deformation and cold-plastic deformation which are carried out under different conditions.

According to the present invention, a combination of the plastic deformation and the sintering can be repeated for more than two times. In this case, the plastic deformation is effected before and/or after the final sintering stage. Specially, when shrinkage of the sintered mass occur during the sintering stage, a clearance is left between the metal pipe and the sintered mass. If it is desired to remove or reduce such clearance, the metal pipe subjected to the sintering operation is passed through at least one plastic deformation stage. In this case, the plastic deformation is preferably carried out by a cold-plastic deformation.

According to another preferred embodiment, the hot-plastic deformation stage follows after the cold wire-drawing stage in order to increase the density of powder filled in the metal pipe. Namely, an initial metal pipe filled freshly with the powder material can be deformed by the cold-plastic deformation easily and effectively since the density of compacted powder is not so high in this stage. To the contrary, after the metal pipe is passed through such cold-plastic deformation and hence the density becomes to a certain level, further increment of the density can be assured by the hot-plastic deformation rather than the cold-plastic deformation. This system of the cold-plastic deformation followed by the hot-plastic deformation is preferable to prepare a compact for the final sintering stage.

The plastic deformation used in the present invention include a rolling work for producing a tape-shaped article, a pipe reduction work for producing a rectangular pipe, a coil forming work for deforming a wire into a coil or the like.

The material of the metal pipe is selected from metals which can be deformed by plastic deformation works and hence is preferably selected from a group comprising Fe, Ni, Co, Ag, Au, Pt, Cu, Al and their alloys. The wire may have any dimension. An endless metal pipe can be produced by feeding the material powder onto an endless metal strip which is deformed into a pipe form in the conventional pipe forming machine and then by passing the resulting pipe filled with the material powder to a tunnel type sintering furnace in the sintering stage. The metal pipe has preferably a wall thickness between 5 and 10 mm.

The present invention is applicable to a variety of ceramics and sintered alloys which are produced by sintering technique and which are difficult to be machined. The ceramics or sintered alloys which can be processed by the present invention include oxide type ceramics such as alumina, beryllia, zirconia, ferrites $(MO, Fe_2O_3)$, PLZT $((Pb,La)(Zr,Ti)O_3)$ or the like, non-oxide type ceramics such as nitride, for example $Si_3N_4$ or AlN, carbide, for example SiC or WC, boron carbide, carbide precipitating type cobalt-based alloy or the like.

One of preferred applications of the present invention is a production of a superconducting wire of compound oxide.

Thus, after the possibility of an existence of new types of superconducting materials having much higher Tc was revealed by Bednorz and Müller who discovered a new oxide type superconductor in 1986 [Z.Phys. B64 (1986) 189], realization of high temperature superconductors have burst onto the scene.

This new type superconducting material is [La, Ba]$_2$CuO$_4$ which has a crystal structure of K$_2$NiF$_4$-type oxide and possesses such a high Tc as 30 K. which is extremely higher than the known superconducting materials, so that it becomes possible to use liquidized hydrogen (b.p.=20.4 K.) or liquidized neon (b.p.=27.3 K.) as a cryogen. It was also reported that C. W. Chu et al. discovered, in the United States of America, another type of superconducting material having the critical temperature of about 90 K. in February 1987. Still other type new superconducting materials which were reported recently are compound oxides of Bi-Sr-Ca-Cu-O system and Tl-Ba-Ca-Cu-O system which exhibit such high Tc as more than 100 K. and which are chemically much stable than the abovementioned YBCO type compound.

However, these new type superconducting materials are ceramic materials of compound oxides which do not possess such a high plasticity as well-known metal type superconducting materials such as Ni-Ti alloy. They are fragile and easily brake even under a very weak mechanical stress, so that they can not or are difficult to be shaped or deformed into an elongated article such as a wire by the conventional plastic deformation techniques.

Japanese patent laid-open No. 61-131,307 discloses a method for manufacturing a superconducting wire from a metal type superconducting material of PbMo$_{0.35}$S$_8$ by the steps comprising compacting a material powder of metal in a metal shell, extruding the metal shell filled with the material powder at a temperature which is higher than 1,000° C., and then drawing the extruded composite. This metal working technique, however, can not apply directly to the ceramic material consisting of compound oxide, because the compound oxide type superconducting materials can not exhibit the superconductivity if a predetermined crystal structure is not realized. In other words, a superconducting wire which shows a high critical temperature and a high critical current density can not be obtained outside a predetermined optimum operational condition.

In order to realize a reliable and practical superconducting structure, it is indispensable that the structure possesses enough strength and tenacity which is sufficient to endure bending force during usage and also has as finer cross sectional dimension as possible in such manner that it can transmit currency at a high critical current density and at a high critical temperature. However, the conventional techniques can not use or are difficult to produce a wire shaped ceramic article possessing satisfactory mechanical strength and tenacity as well as a high dimensional ratio of a length to a cross section.

Taking the abovementioned situation into consideration, the present inventors have proposed processes and methods for producing sintered ceramic wires having a practically usable high dimensional ratio of the length to the cross section without using an organic binder which will be a cause of deterioration of strength and tenacity in the U.S. patent application Ser. Nos. 152,713, 161,480, 182,489 and 189,366. The present inventors have continued to find the optimum condition of the plastic deformation and completed the present invention. A superconducting wire produced according to the present invention exhibits higher critical current density because a wire of sintered powder possesses a high density.

The powder material used for this application may be a powder mixture composed of a compound of an element α selected from IIa group of the Periodic Table, a compound of an element β selected from IIIa group of the Periodic Table, and a compound of an element γ selected from a group comprising Ib, IIb, IIIb, IVa and VIIIa groups of the Periodic Table. The compounds are preferably oxides or carbonates.

More preferably, the powder material is a sintered powder which is prepared by sintering said powder mixture and then pulverizing the resulting sintered mass. The sintered powder is preferably composed of a compound oxide represented by the general formula:

$$(\alpha_{1-x}\beta_x)Cu_yO_z$$

in which α and β means the same definition as above, x is an atomic ratio of β with respect to (α+β) and has a range of 0.1≦x≦0.9, and y and z are respective atomic ratios with respect to (α$_{1-x}$β$_x$) which is considered to be equal to 1 and each satisfies ranges of 0.4≦y≦3.0 and 1≦z≦5 respectively.

The element α is preferably Ba or Sr and the element β is preferably at least one element selected from a group comprising Y, La, Gd, Dy, Ho, Er, Tm, Yb, Nd, Sm, Eu and Lu. An atomic ratio of α to β depends on type or system of the compound oxide or on the combination of α and β.

Thus, the preferable compound oxides are Y-Ba-Cu-O system, La-Ba-Cu-O system and La-Sr-Cu-O system including the following special cases:

Y$_1$Ba$_2$Cu$_3$O$_{7-x}$, Ho$_1$Ba$_2$Cu$_3$O$_{7-x}$, Lu$_1$Ba$_2$Cu$_3$O$_{7-x}$, Sm$_1$Ba$_2$Cu$_3$O$_{7-x}$, Nd$_1$Ba$_2$Cu$_3$O$_{7-x}$, Gd$_1$Ba$_2$Cu$_3$O$_{7-x}$, Eu$_1$Ba$_2$Cu$_3$O$_{7-x}$, Er$_1$Ba$_2$Cu$_3$O$_{7-x}$, Dy$_1$Ba$_2$Cu$_3$O$_{7-x}$, Tm$_1$Ba$_2$Cu$_3$O$_{7-x}$, Yb$_1$Ba$_2$Cu$_3$O$_{7-x}$, La$_1$Ba$_2$Cu$_3$O$_{7-x}$, (La, Sr)$_2$CuO$_{4-x}$ in which x is a number which satisfies a range of 0<x<1.

The above-mentioned compound oxides preferably possess perovskite type or quasi-perovskite type crystal structure. The term quasi-perovskite type means a structure which can be considered to have such a crystal structure that is similar to perovskite-type oxides and includes an orthorhombically distorted perovskite or a distorted oxygen-deficient perovskite or the like.

The sintering operation of the powder mixture is carried out at temperature which is higher than 600° C. but is not higher than the lowest melting point of any component in the material powder to be sintered. If the sintering temperature exceeds the lowest melting point, a liquid phase will be produced, resulting in lowering the superconducting property. To the contrary, if the sintering temperature is not higher than 600° C., a desired sintering reaction for producing a compound oxide can not be achieved.

The sintering conditions depend on the kinds of the metal pipe and of the compound oxide. In the case of LnBa$_2$Cu$_3$O$_{7-x}$ (in which Ln stands for an element selected from a group comprising Y, La, Gd, Dy, Ho, Er, Tm, Yb, Nd, Sm, Eu and Lu), the following sintering conditions are selected preferably:

| Metal pipe | Sintering condition |
|---|---|
| Al | at 550 to 620° C. for 15 to 25 hours |
| Cu | at 750 to 820° C. for 10 to 20 hours |
| Ni | at 700 to 770° C. for 10 to 20 hours |
| Ag | at 900 to 960° C. for 10 to 20 hours |

The optimum sintering conditions are at 600° C. for 20 hours for Al, at 800° C. for 15 hours for Cu, at 750° C. for 15 hours for Ni and at 940° C. for 15 hours for Ag.

The superconductor to which the present invention is applicable may be another type of compound oxide consisting mainly of a compound oxide represented by the formula:

$$\Theta_4(\Phi_{1-q}Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 \leq q \leq 1$, and r is a number which satisfies a range of $-2 \leq r \leq +2$. This system is considered to be a single phase of the following compound oxide or a mixed phase consisting mainly thereof:

$Bi_4Sr_4Ca_4Cu_6O_{20-r}$, $Bi_2Sr_2Ca_2Cu_3O_{10-r}$ or $Tl_4Ba_4Ca_4Cu_6O_{20-r}$, $Tl_2Ba_2Ca_2Cu_3O_{10-r}$, in which r is a number which satisfies a range of $-2 \leq r \leq +2$.

A variety of elongated sintered articles having a high density can be produced by deforming the metal pipe into a desired configuration such as a coil, a band, a profile or the like. If a removable or inflammable core is embedded in the material powder when the powder material is compacted into the metal pipe, a hollow article can be produced.

Now, several embodiments of the process according to the present invention will be described by Examples, but the scope of the present invention should not be limited thereto.

EXAMPLE 1

Ag pipe

Powders of $BaCO_3$, $Y_2O_3$ and CuO each having a purity of more than 99.9% were prepared. After they were mixed in such a proportion by weight as 20.8% of $Y_2O_3$, 54.7% of $Ba_2CO_3$ and 24.5% of CuO, they were kneaded in a wet mill and then dried at 110° C. for one hour. The resulting powder mixture was moulded in a press under a pressure of 100 kg/cm² to produce a compact. The compact was sintered at 940° C. for 15 hours and then pulverized to reduce under 100 mesh. The steps from the compacting to pulverization were repeated for three times.

The resulting fine sintered powder was compacted in silver pipes each having an outer diameter of 20 mm, an inner diameter of 12 mm and a length of 300 mm and opposite ends of the pipe were closed to prepare samples of Ag-1 to Ag-7. Then, the pipes were passed to the following plastic deformation stage and sintering stage:

| Sample No. | Process |
|---|---|
| Ag-1 | A drawing through a die from OD 20 mm to OD 6 mm at room temperature and then sintered |
| Ag-2 | A swaging from OD 20 mm to OD 6 mm at room temperature and then sintered |
| Ag-3 | A swaging from OD 20 mm to OD 6 mm at 900° C. and then sintered |
| Ag-4 | A swaging from OD 20 mm to OD 10 mm at 900° C. and then sintered. After then, another swaging from OD 10 mm to OD 6 mm at 900° C. and then sintered. |
| Ag-5 | A swaging from OD 20 mm to OD 10 mm at 900° C. and then sintered. After then, a die-drawing from OD 10 mm to OD 6 mm at room temperature and then sintered. |
| Ag-6 | A swaging from OD 20 mm to OD 6 mm at 950° C. |

(Note)
OD: an outer diameter of a silver pipe.
Sintering conditions:
Sintering furnace: a tunnel type furnace: Erema
Sintering temperature: 940° C.
Duration of sintering: 15 hours The density and the critical current density were measured by the following conventional methods:

(1) Density (%) of the resulting sintered sample was determined by dividing the weight of a sample by a volume obtained by the specific gravity measurement method in which pores displaced with a liquid is calculated and the result was verified by dot-counting by means of a microscope.

(2) Critical current density (A/cm²) was determined by dividing the value of a current just before a resistance appeared in liquid nitrogen (77K.) by a cross sectional area of a current passage.

The result are summarized in Table 1.

TABLE 1

| Sample No. | metal pipe | Density (%) | Critical current density (A/cm²) |
|---|---|---|---|
| Ag-1 | Ag | 62 | 150 |
| Ag-2 | Ag | 68 | 210 |
| Ag-3 | Ag | 87 | 570 |
| Ag-4 | Ag | 95 | 870 |
| Ag-5 | Ag | 93 | 800 |
| Ag-6 | Ag | Torn due to lack of strength | |

The result shows that samples Ag-3 to 5 subjected to the hot-plastic deformation, particularly the samples Ag-4 and 5 in which a combination of plastic deformation and sintering were repeated possess higher critical current density.

EXAMPLE 2

Al, Cu and Ni pipe

The same material powder as Example 1 was used and same procedure as Example 1 was repeated except that the silver pipes were replaced by aluminum pipes, copper pipes and nickel pipes to prepare samples of Al-1 and -2, Cu-1 and -2 and Ni-1 and -2.

These samples were passed to the following plastic deformation stage and sintering stage:

| Sample No. | Process |
|---|---|
| Al-1 | A swaging from OD 20 mm to OD 2 mm at 600° C. and then sintered at 600° C. for 20 hours. |
| Al-2 | A swaging from OD 20 mm to OD 2 mm at room temperature and then sintered at 600° C. for 20 hours. |
| Cu-1 | A swaging from OD 20 mm to OD 2 mm at 600° C. and then sintered at 800° C. for 15 hours. |
| Cu-2 | A swaging from OD 20 mm to OD 2 mm at room |

-continued

| Sample No. | Process |
|---|---|
| | temperature and then sintered at 800° C. for 15 hours. |
| Ni-1 | A swaging from OD 20 mm to OD 2 mm at 800° C. and then sintered at 750° C. for 15 hours. |
| Ni-2 | A swaging from OD 20 mm to OD 2 mm at room temperature and then sintered at 750° C. for 15 hours. |

(Note)
OD: an outer diameter of the pipe.

The density (%) and the critical current density (A/cm$^2$) determined by the same method as Example 1. The result are summarized in Table 2.

TABLE 2

| Sample No. | metal pipe | Density (%) | Critical current density (A/cm$^2$) |
|---|---|---|---|
| Al-1 | Al | 75 | 280 |
| Al-2 | Al | 58 | 75 |
| Cu-1 | Cu | 80 | 350 |
| Cu-2 | Cu | 61 | 100 |
| Ni-1 | Ni | 89 | 370 |
| Ni-2 | Ni | 63 | 110 |

EXAMPLE 3

Ag pipe

The same material powder as Example 1 was used and same procedure as Example 1 was repeated to prepare samples of Ag-7 to -13.

These samples were passed to the following plastic deformation stage and sintering stage:

| Sample No. | Process |
|---|---|
| Ag-7 | A die-drawing from OD 20 mm to OD 6 mm at room temperature then sintered. |
| Ag-8 | A die-drawing from OD 20 mm to OD 6 mm at 900° C. and then sintered. |
| Ag-9 | Two step swagings: a swaging from OD 20 mm to OD 10 mm at room temperature followed by another swaging from OD 10 mm to OD 6 at room temperature and then sintered. |
| Ag-10 | A die-drawing from OD 20 mm to OD 10 mm at room temperature and then swaging from OD 10 mm to OD 6 at room temperature and then sintered. |
| Ag-11 | Two stage die-drawings: a die-drawing from OD 20 mm to OD 10 mm at 900° C. followed by another die-drawing at 900° C. from OD 10 mm to OD 6 and then sintered. |
| Ag-12 | Two stage swagings: a swaging from OD 20 mm to OD 10 mm at 900° C. followed by another swaging from OD 10 mm to OD 6 mm at 900° C. and then sintered. |
| Ag-13 | A combination of a die-drawing from OD 20 mm to OD 10 mm at 900° C. and a swaging from OD 10 mm to OD 6 mm at 900° C. and then sintered. |

(Note)
OD: an outer diameter of the pipe.

The density (%) and the critical current density (A/cm$^2$) determined by the same method as Example 1. The result are summarized in Table 3.

TABLE 3

| Sample No. | metal pipe | Density (%) | Critical current density (A/cm$^2$) |
|---|---|---|---|
| Ag-7 | Ag | 65 | 127 |
| Ag-8 | Ag | 71 | 131 |
| Ag-9 | Ag | 78 | 283 |
| Ag-10 | Ag | 79 | 302 |
| Ag-11 | Ag | 86 | 646 |
| Ag-12 | Ag | 85 | 621 |

TABLE 3-continued

| Sample No. | metal pipe | Density (%) | Critical current density (A/cm$^2$) |
|---|---|---|---|
| Ag-13 | Ag | 93 | 1,198 |

EXAMPLE 4

Ag and Cu pipes

The same material powder as Example 1 was used and same procedure as Example 1 was repeated to prepare samples of Ag-14 to -16 and Cu-3 to -7.

These samples were passed to the following plastic deformation stage and sintering stage:

| Sample No. | Process |
|---|---|
| Ag-14 | A die-drawing from OD 20 mm to OD 6 mm at room temperature then sintered. |
| Ag-15 | A combination of a die-drawing from OD 20 mm to OD 10 mm at room temperature and a swaging from OD 10 mm to OD 6 mm at room temperature then sintered. |
| Ag-16 | A combination of a die-drawing from OD 20 mm to OD 10 mm at room temperature and a swaging from OD 10 mm to OD 6 mm at 910° C. then sintered. |
| Cu-3 | A die-drawing from OD 20 mm to OD 6 mm at room temperature then sintered. |
| Cu-4 | A swaging from OD 20 mm to OD 6 mm at room temperature then sintered. |
| Cu-5 | A combination of a die-drawing from OD 20 mm to OD 10 mm at room temperature and a swaging from OD 10 mm to OD 6 mm at room and then sintered. |
| Cu-6 | A combination of a die-drawing from OD 20 mm to OD 10 mm at room temperature and a swaging from OD 10 mm to OD 6 mm at 900° C. then sintered. |
| Cu-7 | A combination of a die-drawing from OD 20 mm to OD 10 mm at 900° C. and a swaging from OD 10 mm to OD 6 mm at 900° C. then sintered. |

(Note)
OD: an outer diameter of the pipe.
Sintering conditions:
Sintering furnace: a tunnel type furnace: Erema
Sintering temperature:
940° C. for 15 hours for Ag
800° C. for 15 hours for Cu The density (%) and the critical current density (A/cm$^2$) determined by the same method as Example 1. The result are summarized in Table 4.

TABLE 4

| Sample No. | metal pipe | Density (%) | Critical current density (A/cm$^2$) |
|---|---|---|---|
| Ag-14 | Ag | 62 | 102 |
| Ag-15 | Ag | 82 | 436 |
| Ag-16 | Ag | 91 | 1,015 |
| Cu-3 | Cu | 63 | 121 |
| Cu-4 | Cu | 62 | 117 |
| Cu-5 | Cu | 80 | 325 |
| Cu-6 | Cu | 93 | 932 |
| Cu-7 | Cu | 84 | 487 |

EXAMPLE 5

Hot-rolling

The same material powder as Example 1 was used but silver pipes are replaced by different pipes having an outer diameter of 10 mm, an inner diameter of 7 mm and a length of 1,000 mm and same procedure as Example 1 was repeated to prepare samples of Ag-17 to -21.

These samples were passed to the following hot-rolling stage and sintering stage:

| Sample No. | Process |
|---|---|
| Ag-17 | A die-drawing from OD 10 mm to OD 3 mm at room temperature then sintered. |
| Ag-18 | A swaging from OD 10 mm to OD 3 mm at room temperature then sintered. |
| Ag-19 | A rolling from OD 10 mm to OD 3 mm at room temperature then sintered. |
| Ag-20 | A rolling from OD 10 mm to OD 3 mm at 750° C. then sintered. |
| Ag-21 | A rolling from OD 10 mm to OD 3 mm at 800° C. then sintered. |

(Note)
OD: an outer diameter of a silver pipe.
Sintering conditions:
Sintering furnace: a tunnel type furnace: Erema
Sintering temperature: 940° C.
Duration of sintering: 15 hours The density (%) and the critical current density (A/cm$^2$) determined by the same method as Example 1. The result are summarized in Table 5.

TABLE 5

| Sample No. | metal pipe | Density (%) | Critical current density (A/cm$^2$) |
|---|---|---|---|
| Ag-17 | Ag | 64 | 128 |
| Ag-18 | Ag | 72 | 447 |
| Ag-19 | Ag | 76 | 683 |
| Ag-20 | Ag | 82 | 824 |
| Ag-21 | Ag | 87 | 942 |

We claim:

1. A process for producing an elongated sintered article, comprising the steps of:
    filling a metal pipe with a material powder of oxide superconductor, hot plastically deforming the metal pipe filled with the material powder at a temperature between 750° C. and 1,100° C., which temperature is higher than a recrystallization temperature of the metal of which the metal pipe is made and lower than a melting point of said metal by at least 10° C., and subsequently heat treating the deformed metal pipe filled with the material powder, thereby sintering said material powder, wherein said hot plastically deforming step exerts a compressive stress onto the material powder and increases the density of said material powder within said metal pipe.

2. The process set forth in claim 1, wherein said hot plastically deforming step comprises at least one unit operation selected from the group consisting of wire-drawing through at least one die, wire-drawing by at least one roller die, extrusion, forging, swaging and rolling.

3. The process set forth in claim 2, wherein said hot plastically deforming step comprises a rolling operation performed by rolls.

4. The process set forth in claim 1, further including cold-plastically deforming the metal pipe filled with the material powder.

5. The process set forth in claim 4, wherein said cold-plastically deforming step comprises at least one unit operation selected from the group consisting of wire-drawing through at least one die, wire-drawing by at least one roller die, extrusion, forging, swaging and rolling.

6. The process set forth in claim 4, wherein said cold-plastically deforming step is carried out after said hot plastically deforming step.

7. The process set forth in claim 1, wherein said hot plastically deforming step comprises a plurality of unit operations.

8. The process set forth in claim 1, wherein said hot plastically deforming step and said subsequent heat treatment sintering step are repeated for more than two times.

9. The process set forth in claim 1, wherein the metal pipe is made of a metal selected from the group consisting of Fe, Ni, Co, Ag, Au, Pt, Cu, Al and their alloys.

10. The process set forth in claim 1, wherein said oxide superconductor powder is a sintered oxide powder of an element selected from group IIa of the Periodic Table, an element selected from group IIIa of the Periodic Table and copper.

11. The process set forth in claim 10, wherein said oxide powder is represented by the formula:

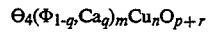

$$\Theta_4(\Phi_{1-q}Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0<q<1$, and r is a number which satisfies a range of $-2 \leq r \leq +2$.

12. The process set forth in claim 10, wherein said oxide powder is represented by the general formula:

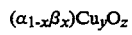

$$(\alpha_{1-x}\beta_x)Cu_y O_z$$

in which $\alpha$ is an element selected from group IIa of the Periodic Table and $\beta$ is an element selected from group IIIa of the Periodic Table, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively.

13. The process set forth in claim 12, wherein said element $\alpha$ is Ba or Sr and said element $\beta$ is at least one element selected from the group consisting of Y, La, Gd, Dy, Ho, Er, Tm, Yb, Nd, Sm, Eu and Lu.

* * * * *